United States Patent
Mo et al.

(10) Patent No.: US 9,490,767 B2
(45) Date of Patent: Nov. 8, 2016

(54) NETWORK SIGNAL COUPLING CIRCUIT ASSEMBLY

(71) Applicant: AJOHO ENTERPRISE CO., LTD., Taipei (TW)

(72) Inventors: Chia-Ping Mo, Taipei (TW); You-Chi Liu, Taipei (TW)

(73) Assignee: AJOHO ENTERPRISE CO., LTD., Taipei (TW)

( * ) Notice: Subject to any disclaimer, the term of this patent is extended or adjusted under 35 U.S.C. 154(b) by 0 days.

(21) Appl. No.: 14/789,534

(22) Filed: Jul. 1, 2015

(65) Prior Publication Data

US 2015/0304139 A1 Oct. 22, 2015

Related U.S. Application Data

(63) Continuation of application No. 13/893,962, filed on May 14, 2013, now Pat. No. 9,252,735, which is a continuation-in-part of application No. 13/544,538, filed on Jul. 9, 2012, now Pat. No. 8,878,628, application No. 14/789,534, which is a continuation of application No. 13/907,413, filed on May 31, 2013, now Pat. No. 9,252,736, which is a continuation-in-part of application No. 13/544,538.

(30) Foreign Application Priority Data

Apr. 6, 2012 (TW) .............................. 101112238 A
Feb. 4, 2013 (TW) .............................. 102202378 U
Feb. 4, 2013 (TW) .............................. 102202379 U

(51) Int. Cl.
*H03H 7/38* (2006.01)
*H03H 7/00* (2006.01)
*H05K 1/02* (2006.01)
*H04L 25/02* (2006.01)
*H04L 25/08* (2006.01)
*H04L 12/933* (2013.01)

(52) U.S. Cl.
CPC ............ *H03H 7/00* (2013.01); *H04L 25/0266* (2013.01); *H04L 25/0272* (2013.01); *H04L 25/085* (2013.01); *H04L 49/109* (2013.01); *H05K 1/0233* (2013.01); *H05K 1/0245* (2013.01)

(58) Field of Classification Search
CPC . H03H 7/00; H04L 25/0266; H04L 25/0272; H04L 25/085; H04L 49/109; H05K 1/0233; H05K 1/0245
USPC ....................................................... 333/131
See application file for complete search history.

(56) References Cited

U.S. PATENT DOCUMENTS

| | | | |
|---|---|---|---|
| 3,681,612 | A | 8/1972 | Vogl et al. |
| 4,761,623 | A | 8/1988 | Schneider |
| 8,203,400 | B2 | 6/2012 | Chen et al. |
| 8,319,579 | B2 | 11/2012 | Zhuang et al. |
| 2011/0059694 | A1 | 3/2011 | Audic |
| 2013/0278355 | A1 | 10/2013 | Shibata |

*Primary Examiner* — Robert Pascal
*Assistant Examiner* — Kimberly Glenn
(74) *Attorney, Agent, or Firm* — Muncy, Geissler, Olds & Lowe, P.C.

(57) ABSTRACT

A network signal coupling circuit installed in a circuit board and coupled between a network-on-chip and a network connector is disclosed to include a coupling module including a first capacitor connected in series to each wire of one respective two-wire channel of the signal coupling circuit thereof for coupling network signals and removing noises. Subject to the capacitance reactance characteristic that the signal attenuation is reduced when the frequency rises and the capacitive coupling characteristic that the signal coupling performance is enhanced when the frequency rises, the network signal coupling circuit assembly is practical for high frequency network applications to enhance signal coupling and transmission performance.

9 Claims, 7 Drawing Sheets

NETWORK SIGNAL COUPLING CIRCUIT ASSEMBLY

CROSS-REFERENCE TO RELATED APPLICATIONS

This application is a Continuation of co-pending application Ser. No. 13/893,962, filed on May 14, 2013, which is a Continuation-in-Part of application Ser. No. 13/544,538, filed on Jul. 9, 2012, which issued as U.S. Pat. No. 8,878,628 on Nov. 4, 2014, and this application is a Continuation of co-pending application Ser. No. 13/907,413, filed on May 31, 2013, which is also a Continuation-in-Part of application Ser. No. 13/544,538, filed on Jul. 9, 2012, which issued as U.S. Pat. No. 8,878,628 on Nov. 4, 2014, for which priority is claimed under 35 U.S.C. §120, and this application claims priority of Application No. 102202379 filed in Taiwan on Feb. 4, 2013, Application No. 102202378 filed in Taiwan on Feb. 4, 2013, and Application No. 101112238 filed in Taiwan on Apr. 6, 2012, under 35 U.S.C. §119; the entire contents of all of which are hereby incorporated by reference.

BACKGROUND OF THE INVENTION

1. Field of the Invention

The present invention relates to network technology and more particularly, to a network signal coupling circuit assembly, which uses a signal coupling circuit with capacitor-based coupling modules for signal transmission between a network connector and a network-on-chip to enhance the signal coupling performance subject to the characteristic of the capacitors that capacitive reactance is relatively reduced and the coupling strength is relatively enhanced when the frequency is getting higher.

2. Description of the Related Art

Following fast development of computer technology, desk computers and notebook computers are well developed and widely used in different fields for different applications. It is the market trend to provide computers having high operating speed and small size. Further, network communication technology brings people closer, helping people to gather information about living, learning, working and recreational activities. By means of network communication, people can communicate with one another to send real time information, advertising propaganda or e-mail. Further, through the Internet, people can search information, send instant messages, or play on-line video games. The development of computer technology makes the relationship between people and network unshakable and inseparable.

Connecting a computer or electronic apparatus to a network for data transmission can be done by a cable connection technique or a wireless transmission protocol. A cable connection technique needs the installation of a network connector. A network signal coupling circuit assembly has built therein transformer modules and common-mode suppression modules. As shown in FIG. 7, a conventional network signal coupling assembly comprises a circuit board A, and multiple transformer coils B and Filter coils C installed in the circuit board A. Each of the transformer coils B and filter coils C comprises a wire core D, and a lead wire D1 wound round the wire core D with the ends thereof bonded to respective contacts at the circuit board A. Because the winding of the transformer coils B and the filter coils C cannot be achieved by an automatic machine and must be done by labor, the fabrication efficiency of this kind of network connector is low. Further, the lead wire may be broken easily during winding, thereby increasing the cost. Further, fabrication by labor cannot accurately control the coil winding tightness and number of turns, affecting product quality stability.

Further, following the development of network application technology, network data transmission capacity has been greatly increased. To satisfy the demand for high data transmission capacity, network transmission speed has been greatly improved from the early 10 Mbps to 100 Mbps or 1 Gbps. Nowadays, Fiber-optic network transmission speed can be as high as 10 Gbps and up. A transformer coil B is an inductor, the impedance (Z) of an inductor is an inductive reactance, and its unit is ohm ($\Omega$). The inductive reactance is calculated subject to the equation of $Z=2\pi*F*L$), in which: F=Frequency and its unit is the hertz (Hz); L=inductance of inductor and its unit is Henry (H). The aforesaid network connector utilizes the characteristic of the inductance of the transformer coils B to isolate electricity and to couple signals. In order to transmit signals from the primary side to the secondary side, each transformer coil B must have a predetermined inductance. From the above equation, it is known that inductive reactance is directly proportional to the working Frequency and the inductance of the inductor. When increasing the signal Frequency, the inductance reactance will be relatively increased (see the comparative curve of Frequency and capacitive reactance based on a 350 µH capacitor). However, the increase of inductive reactance causes the increase of signal attenuation, leading to network disconnection or dramatic slowdown in network transmission speed. As shown in FIG. 7, when the insertion loss of the transformer reaches −3 db, the response frequency becomes 0.45 MHz-240 MHz. When being over this range, the insertion loss will increase rapidly. Therefore, the working Frequency must be controlled within a relatively narrower bandwidth. Further, subject to the characteristic curve of the transformer coils B of low Frequency with low intensity, middle Frequency with high intensity and high Frequency with low intensity, when the network transmission speed reaches 1 Gbps, the signal intensity of the transformer coils B will be lowered, unable to meet the product requirements.

Therefore, there is a strong demand for a network signal coupling circuit assembly, which eliminates the drawbacks of instable quality, high cost, automated production incapability and low signal intensity under a high network transmission speed of the prior art design.

SUMMARY OF THE INVENTION

The present invention has been accomplished under the circumstances in view. According to one aspect of the present invention, the network signal coupling circuit assembly comprises a circuit board, a network-on-chip installed in the circuit board, a network connector, and a signal coupling circuit electrically coupled between the network-on-chip and the network connector, wherein the network-on-chip is a current-mode design; the signal coupling circuit comprises opposing first connection end and second connection end, multiple two-wire channels coupled between the first connection end and the second connection end, and a plurality of coupling modules respectively installed in the two-wire channels and respectively electrically coupled between the first connection end and the second connection end. Further, each two-wire channel consists of two wires. Each coupling module comprises a first capacitor connected to each wire. Subject to the characteristic that increasing the signal frequency can relatively increases the signal coupling strength of the capacitors, the signal coupling performance of the signal coupling circuit can be relatively enhanced if the network frequency is getting higher.

According to another aspect of the present invention, the network-on-chip is a voltage-mode design. Subject to the characteristics of the first capacitors of the coupling modules, supplying a voltage to the first end of each first capacitor can cause the first end of the respective first capacitor to generate a transient unipolar charge and the opposing second end of the respective first capacitor to generate another transient unipolar charge. When the supplied voltage is stopped after a predetermined period of time, the second end of the respective first capacitor of each coupling module discharges the negative charge through the wires of the respective two-wire channel, achieving signal coupling transmission. Further, the first capacitors can also provide an isolation effect to prohibit the signal from passing through the wires of the respective two-wire channel directly, preventing reverse current.

According to still another aspect of the present invention, the signal coupling circuit is used with a voltage mode network-on-chip. The charge and discharge speed of the first capacitors of the coupling modules has a great concern with the time constant, thus, the time constant must match the signal cycle so that the charge and discharge time can just let the signal be transmitted in integrity without interruption. Increasing the capacitance of the first capacitors of the coupling modules relatively increases the time constant. Preferably, the capacitance of the first capacitors is in the range of 100 µF~0.01 µF, or most preferably 0.1 µF.

According to still another aspect of the present invention, the signal coupling circuit can be configured to provide a plurality of coupling modules respectively installed in the two-wire channels and respectively electrically coupled between the first connection end and the second connection end, and a plurality of filter modules respectively installed in the two-wire channels and respectively electrically coupled between and the respective coupling modules and the first connection end or second connection end. In one embodiment of the invention, each filter module comprises an inductor electrically connected in series to each wire of the respective two-wire channel. In another embodiment of the invention, each filter module comprises two second capacitors electrically connected in series between the two wires of the respective two-wire channel with the midpoint between the two second capacitors electrically connected to a second grounding terminal. By means of the inductors or second capacitors, the filter modules can effectively remove noises from the network signal.

DETAILED DESCRIPTION OF THE PREFERRED EMBODIMENT

Figure 1:
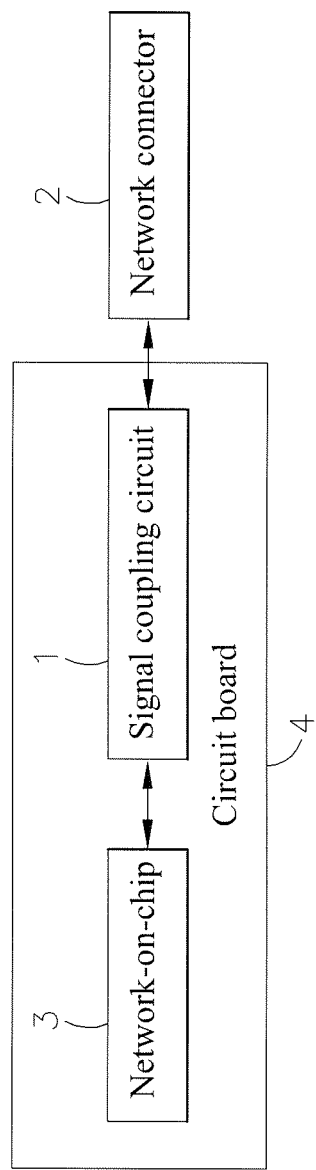
FIG. 1 is a circuit block diagram of a network signal coupling circuit assembly in accordance with the present invention.
Figure 2:
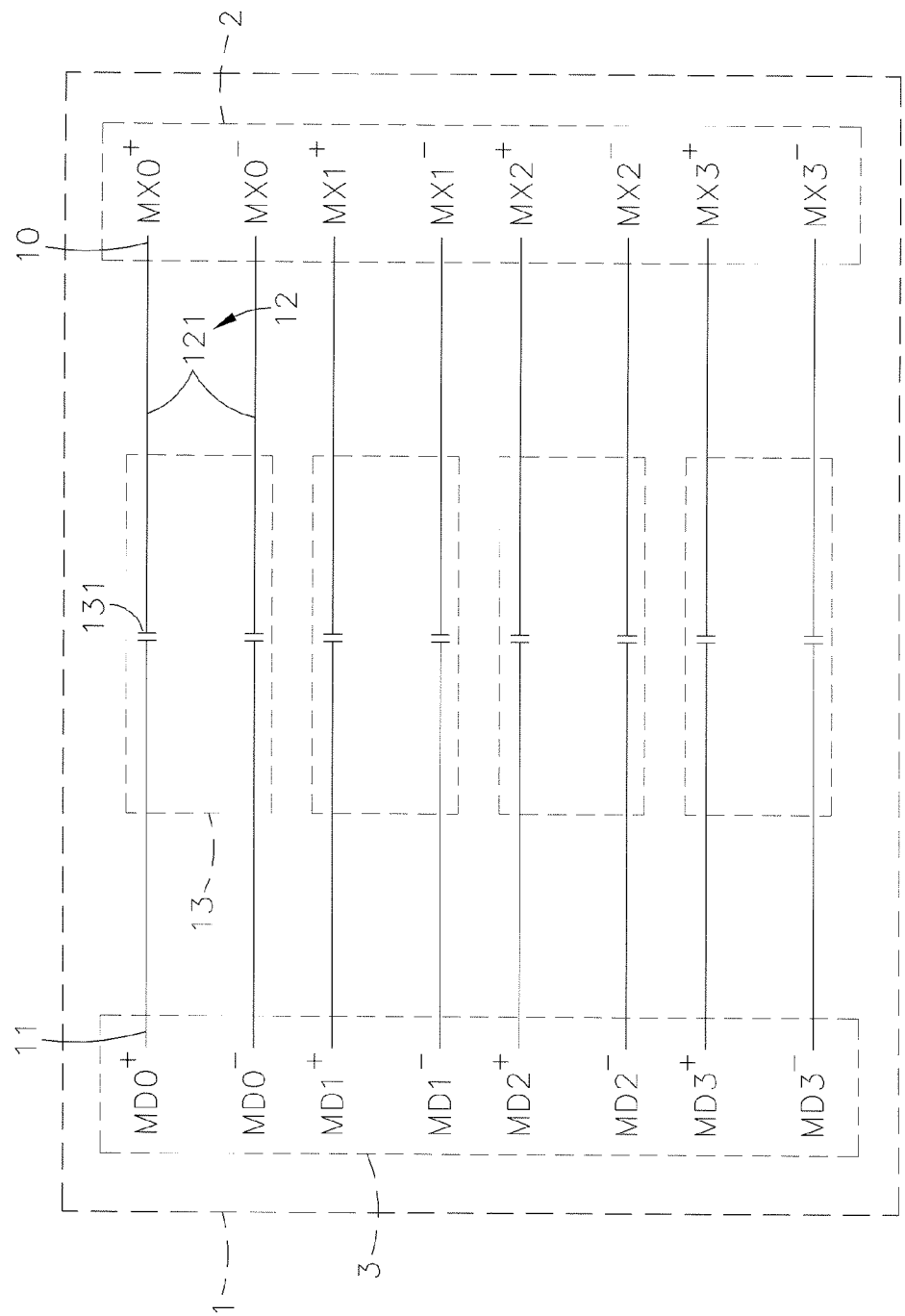
FIG. 2 is a simple circuit diagram of the signal coupling circuit of the network signal coupling circuit assembly in accordance with the present invention.

Referring to FIGS. 1 and 2, a simple circuit block diagram and a simple circuit diagram of a network signal coupling circuit assembly in accordance with the present invention are shown. As illustrated, the network signal coupling circuit assembly comprises a signal coupling circuit 1 installed in a circuit board 4 and having a first connection end 10 thereof electrically connected to a network connector 2 and an opposing second connection end 11 thereof electrically connected to a network-on-chip 3. The network-on-chip 3 is a current-mode design, and therefore, the network-on-chip 3 outputs electric current to the signal coupling circuit 1. The signal coupling circuit 1 comprises a plurality of two-wire channels 12 electrically connected in parallel between the first connection end 10 and the second connection end 11, and a plurality of coupling modules 13 respectively installed in the two-wire channels 12 and respectively electrically coupled between the first connection end 10 and the second connection end 11. Each two-wire channel 12 consists of two wires 121. Further, each coupling module 13 comprises a first capacitor 131 connected to each wire 121.

Figure 3:
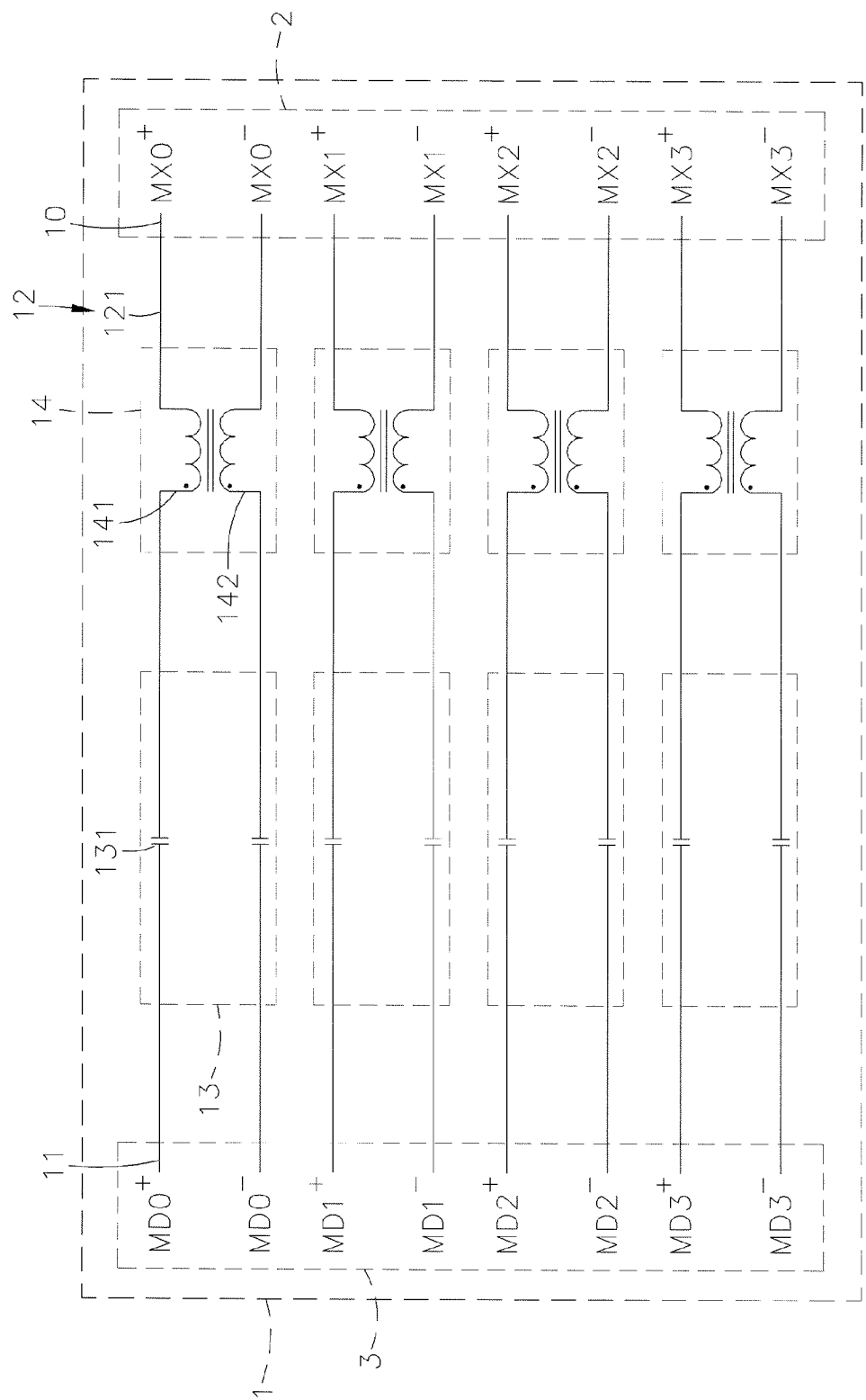
FIG. 3 is a simple circuit diagram of an alternate form of the signal coupling circuit of the network signal coupling circuit assembly in accordance with the present invention.
Figure 4:
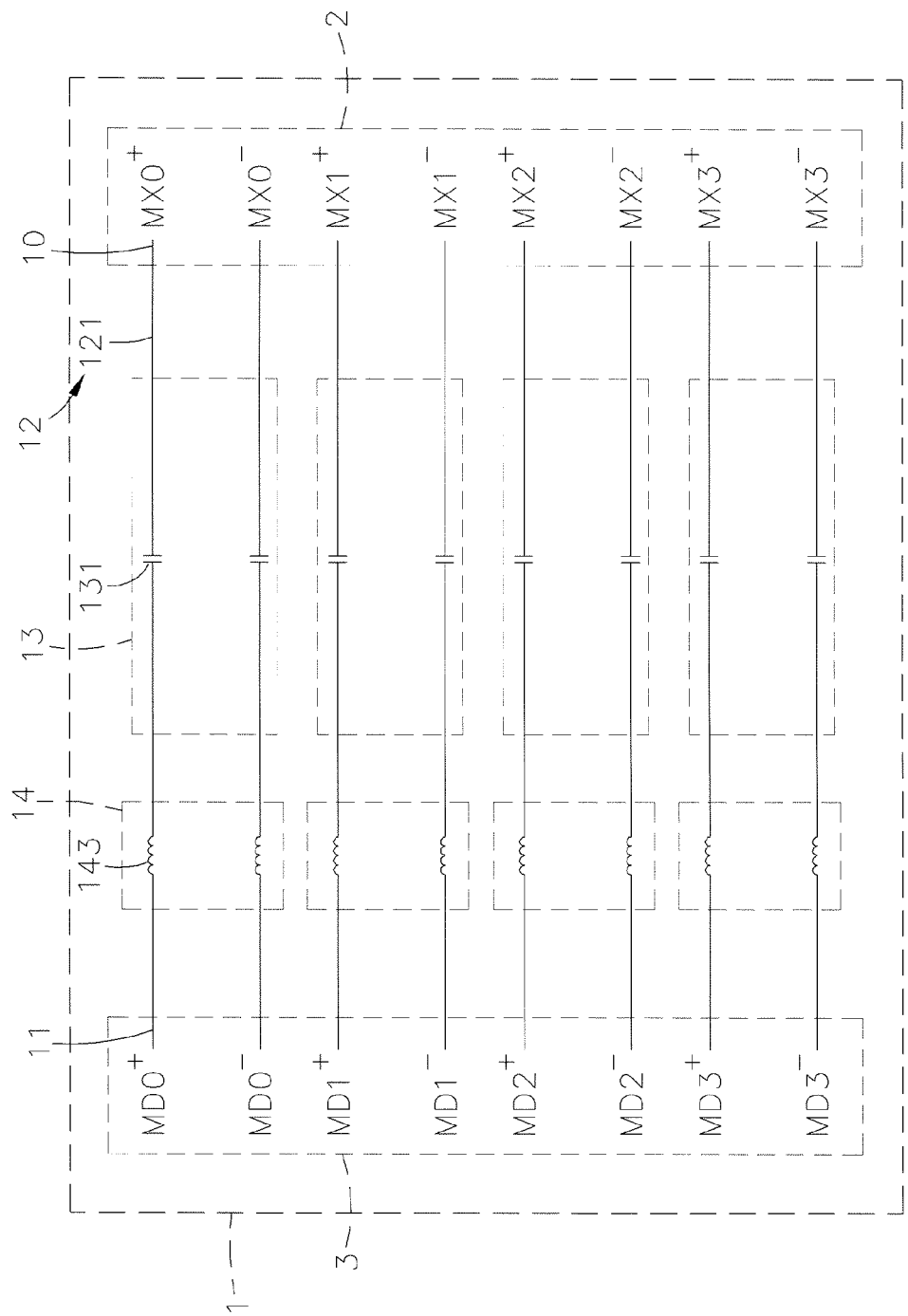
FIG. 4 is a simple circuit of another alternate form of the signal coupling circuit of the network signal coupling circuit assembly in accordance with the present invention.
Figure 5:
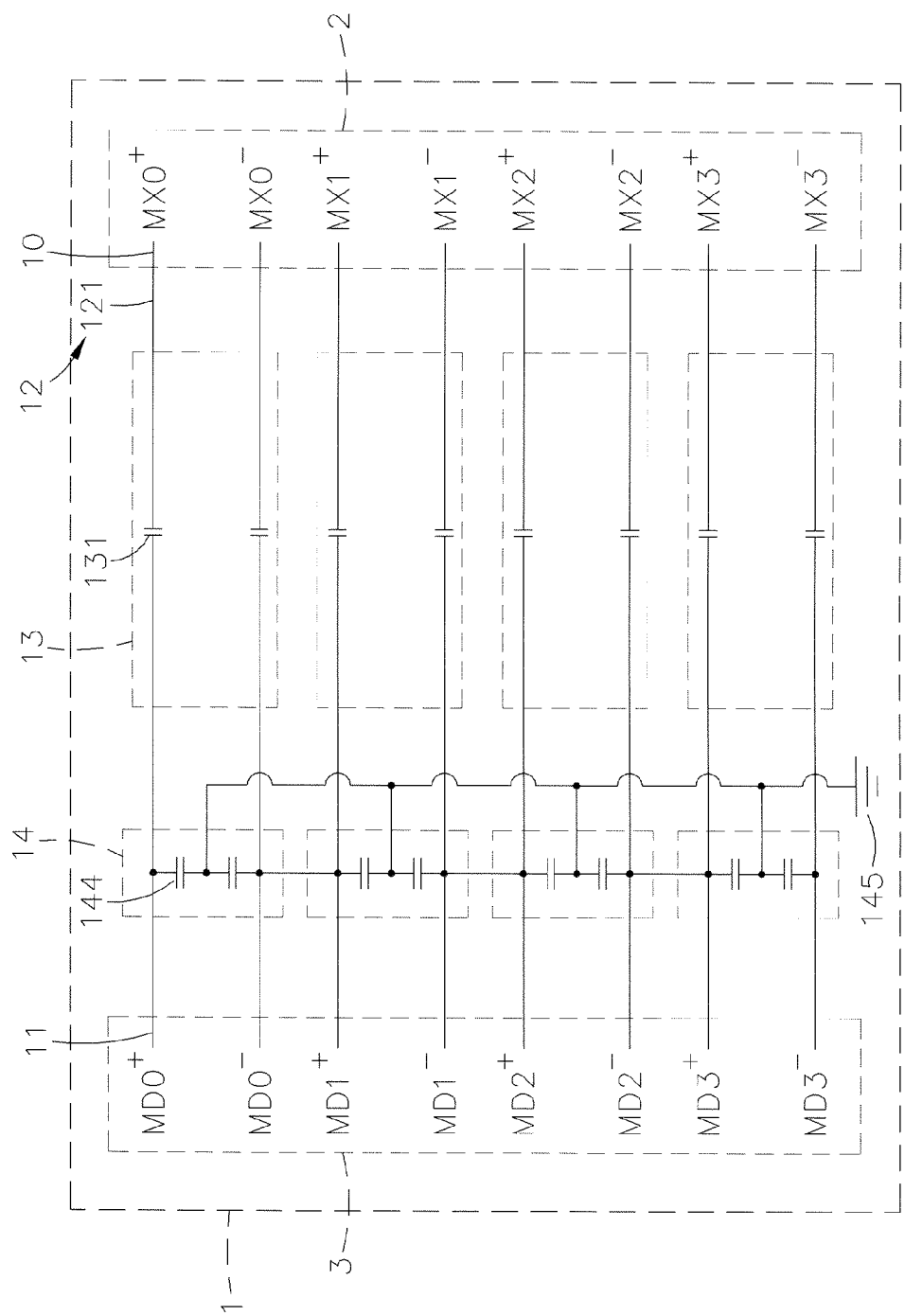
FIG. 5 is a simple circuit of still another alternate form of the signal coupling circuit of the network signal coupling circuit assembly in accordance with the present invention.

Referring to FIGS. 3-5 and FIGS. 1 and 2 again, the network-on-chip 3 is installed in the circuit board 4 and electrically coupled with the signal coupling circuit 1. The network signal coupling circuit assembly further comprises a plurality of filter modules 14 respectively installed in the two-wire channels 12 and respectively electrically coupled between the first connection end 10 and the respective coupling modules 13. Alternatively, each filter module 14 can be coupled between the second connection end 11 and the respective coupling module 13. Further, each filter module 14 comprises a first coil 141 and a second coil 142 respectively coupled to the two wires 121 of the respective two-wire channel 12.

The first connection end 10 of the signal coupling circuit 1 is electrically coupled to respective contacts of the network connector 2. The second connection end 11 of the signal coupling circuit 1 is electrically coupled to respective pins of the network-on-chip 3. The wires 121 of the two-wire channel 12 are respectively electrically coupled to $MD0^+/MX0^+$; $MD0^-/MX0^-$; $MD1^+/MX1+$; $MD1^-/MX1^-$; $MD2^+/MX2^+$; $MD2^-/MX2^-$; $MD3^+/MX3^+$; $MD3^-/MX3^-$. However, this configuration layout is changeable to fit different design requirements.

In the aforesaid arrangement of the present invention, each first capacitor 131 of each coupling module 13 of the signal coupling circuit 1 of the network signal coupling circuit assembly at one wire 121 of the respective two-wire channel 12 enables the two wires 121 of the respective two-wire channel 12 to be coupled together. Preferably, the capacitance of the first capacitor 131 is 0.1 µF; the equivalent resistance at one end of the first capacitor 131 adjacent to the network-on-chip 3 is 49.9 ohm ($\Omega$); the equivalent resistance at the other end of the first capacitor 131 adjacent to the network connector 2 is 75 ohm ($\Omega$). The impedance (Z) of the first capacitors 131 is a capacitive reactance of which the unit is ohm (Ω). The capacitive reactance is measured subject to the equation of $Z=\frac{1}{2}(2\pi*F*C)$, in which: F=Frequency and its unit is hertz (Hz); C=capacitance and its unit is Farad (F). The invention utilizes the characteristics of the first capacitors 131 to isolate electricity and to couple signal. From the above equation, we can know that the capacitive reactance is inversely proportional to the operating frequency and the capacitance. Thus, under the condition that the capacitance of the first capacitors 131 remains unchanged, the capacitance reactance will be relatively reduced and the signal attenuation will also be relatively reduced when the signal frequency is increased (see FIG. 3), achieving better network linking performance and faster signal transmission speed. By means of the characteristic that the intensity of capacitor rises subject to increase of frequency, capacitors are effective for use in a high-frequency (wideband) network (greater than 1 Gbps) to utilize isolated DC current for creating an electric field induction for coupling signals. Further, the characteristics of the capacitors can also enhance coupling of high-frequency network signals.

The network-on-chip 3 outputs a voltage to the signal coupling circuit 1.

As described above, the coupling modules 13 are respectively installed in the two-wire channels 12 and respectively electrically coupled between the first connection end 10 and the second connection end 11. Further, each coupling module 13 comprises the first capacitor 131 connected to each wire 121 of the respective two-wire channel 12. In the embodiment shown in FIG. 2, the filter modules 14 are respectively installed in the two-wire channels 12 and respectively electrically coupled between the first connection end 10 and the respective coupling modules 13; each filter module 14 comprises the first coil 141 and a second coil 142 respectively coupled to the two wires 121 of the respective two-wire channel 12. In the embodiment shown in FIG. 4, the filter modules 14 are respectively installed in the two-wire channels 12 and respectively electrically coupled between the second connection end 11 and the respective coupling modules 13, wherein each filter module 14 comprises an inductor 143 electrically connected in series to each wire 121 of the respective two-wire channel 12. In the embodiment shown in FIG. 5, each filter module 14 comprises two second capacitors 144 electrically connected in series between the two wires 121 of the respective two-wire channel 12 with the midpoint between the two second capacitors 144 electrically connected to a second grounding terminal 145. Further, because the filter modules 14 are simply adapted for removing noises from the signal, the filter modules 14 can be respectively installed in the two-wire channels 12 and respectively electrically coupled between the respective coupling modules 13 and the first connection end 10 or second connection end 11 to achieve the same noise filtering effect.

The aforesaid network-on-chip 3 is a voltage-mode chip adapted to provide a driving voltage to the signal coupling circuit 1. Because signal is subject to variations in voltage during its transmission, each coupling module 13 must provide a resistor for generating a voltage if the signal coupling circuit 1 is used in a current-mode network-on-chip. Using the signal coupling circuit 1 in the aforesaid voltage-mode network-on-chip 3 does not need to install resistors in the coupling modules 13. As stated above, each coupling module 13 of the signal coupling circuit 1 of the network signal coupling circuit assembly in accordance with the present invention comprises two first capacitors 131 respectively electrically connected to the two wires 121 of the respective two-wire channel 12. Subject to the characteristics of the first capacitors 131, supplying a voltage to one end (the first end) of each first capacitor 131 can cause the first end of the respective first capacitor 131 to generate a transient unipolar charge, for example, positive charge, and the other end (the second end) of the respective first capacitor 131 to generate another transient unipolar charge, for example, negative charge. When the supplied voltage is stopped after a predetermined period of time, the other end (the second end) of the respective first capacitor 131 discharges the negative charge through the wires 121 of the respective two-wire channel 12, achieving signal coupling transmission. At the same time, the first capacitor 131 prohibits the signal from passing through the wires 121 of the respective two-wire channel 12 directly, preventing reverse current. However, because the charge and discharge speed of the first capacitors 131 has a great concern with the time constant, the time constant must match the signal cycle so that the charge and discharge time can just let the signal be transmitted in integrity without interruption. Increasing the capacitance of the first capacitors 131 relatively increases the time constant. Preferably, the capacitance of the first capacitors 131 is in the range of 100 μF~0.01 μF, or most preferably 0.1 μF.

Further, during the transmission of a network signal, other signals may enter, producing noises. These noises must be removed. In the embodiment shown in FIG. 4, the inductors 143 of the filter module 14 that are respectively connected in series to the wires 121 of the two-wire channels 12 can be magnetic beads, chip beads, plug-in beads, wire wound inductors, chip inductors, plug-in inductors or common mode inductors. In the embodiment shown in FIG. 5, each filter module 14 comprises two second capacitors 144 electrically connected in series between the two wires 121 of the respective two-wire channel 12 with the midpoint between the two second capacitors 144 electrically connected to a second grounding terminal 145. The inductors 143 have low pass filtering characteristics for removing high frequency noises from the signal band. The second capacitors 144 have high pass filtering characteristics. Further, lowering the impedance of the second capacitors 144 can relatively increase the filtered signal frequency. Thus, by means of adjusting the impedance of the second capacitors 144, noises can be removed while letting the network signal pass, achieving the effect of removing low frequency noises.

Figure 6:
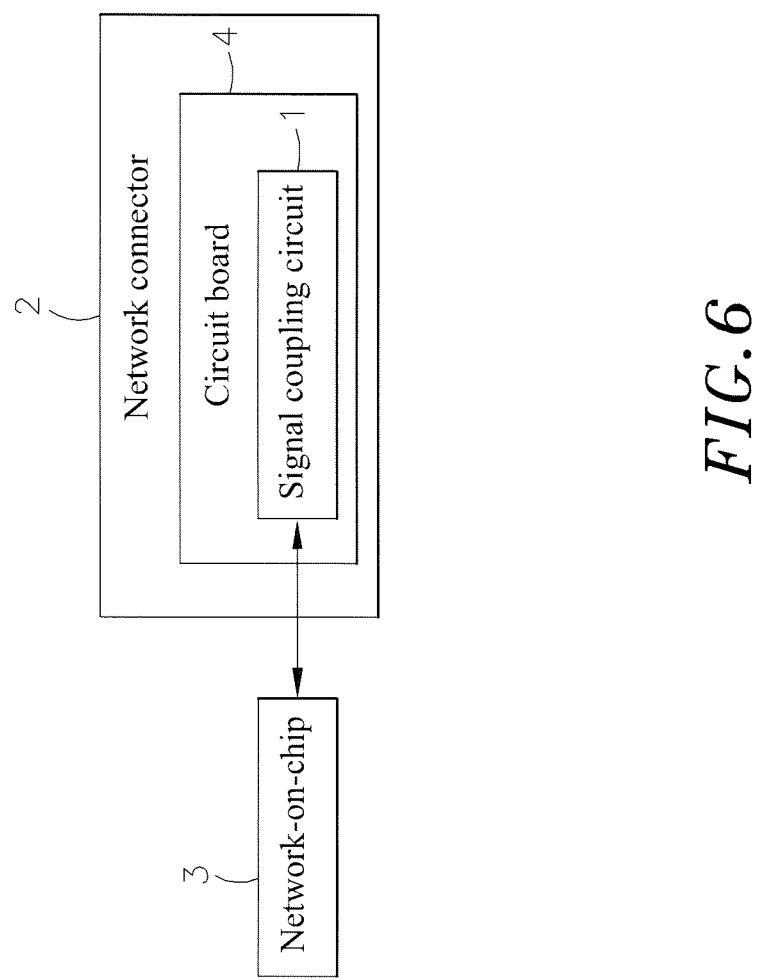
FIG. 6 is a circuit block diagram of an alternate form of the network signal coupling circuit assembly in accordance with the present invention.
Figure 7:
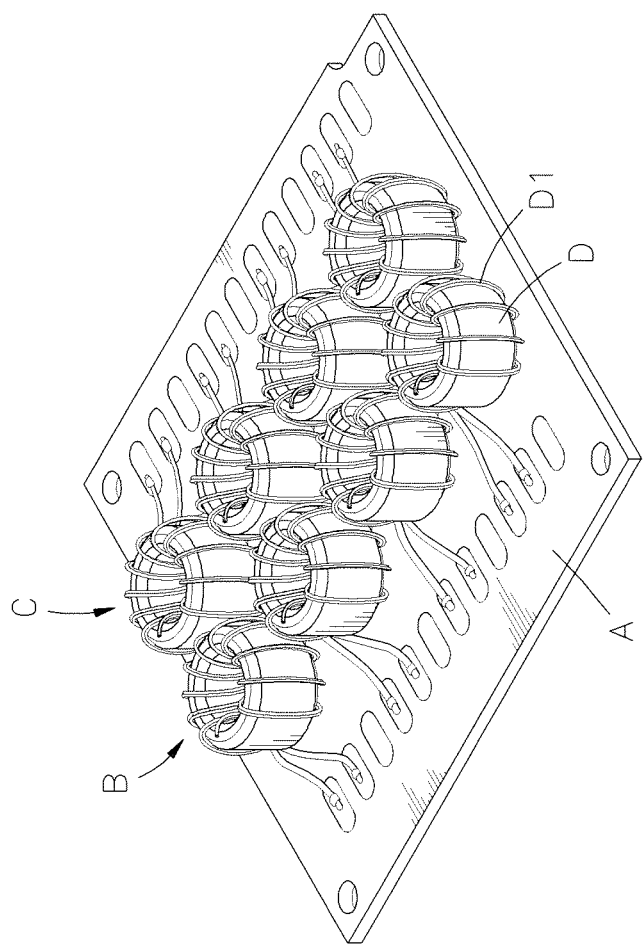
FIG. 7 is an oblique top elevational view of a network signal coupling circuit assembly according to the prior art.

Referring to FIGS. 1 and 6 again, the signal coupling circuit 1 and the network-on-chip 3 can be directly installed in the circuit board 4, enabling the signal coupling circuit 1 to be electrically coupled with the network connector 2 and the network-on-chip 3, as shown in FIG. 1. Alternatively, the signal coupling circuit 1 can be installed in the circuit board 4 and then installed with the circuit board 4 in the network connector 2, and then electrically coupled with the network-on-chip 3 that is mounted in an external circuit board. The arrangement of the network connector 2 and the network-on-chip 3 is the known art and not within the scope of the present invention, and therefore, no further detailed description in this regard will be necessary.

In actual application, the invention has the advantages and features as Follows:

1. In the case that the network-on-chip 3 is a current-mode design, the signal coupling circuit 1 comprises opposing first connection end 10 and second connection end 11, multiple two-wire channels 12 coupled between the first connection end 10 and the second connection end 11, and a plurality of coupling modules 13 respectively installed in the two-wire channels 12 and respectively electrically coupled between the first connection end 10 and the second connection end 11, wherein each two-wire channel 12 consists of two wires 121; each coupling module 13 comprises a first capacitor 131 connected to each wire 121. Subject to the characteristic that increasing the signal frequency can relatively increases the signal coupling strength of the capacitors, the signal coupling performance of the signal coupling circuit can be relatively enhanced if the network frequency is getting higher.

2. In the case that the network-on-chip 3 is a voltage-mode design, the signal coupling circuit 1 comprises opposing first connection end 10 and second connection end 11, multiple two-wire channels 12 coupled between the first connection end 10 and the second connection end 11, and a plurality of coupling modules 13 respectively installed in the two-wire channels 12 and respectively electrically coupled between the first connection end 10 and the second connection end 11, wherein each two-wire channel 12 consists of two wires 121; each coupling module 13 comprises a first capacitor 131 connected to each wire 121. Subject to the characteristics of the first capacitors 131, supplying a voltage to the first end of each first capacitor 131 can cause the first end of the respective first capacitor 131 to generate a transient unipolar charge and the opposing second end of the respective first capacitor 131 to generate another transient unipolar charge. When the supplied voltage is stopped after a predetermined period of time, the second end of the respective first capacitor 131 of each coupling module 13 discharges the negative charge through the wires 121 of the respective two-wire channel 12, achieving signal coupling transmission. Further, the first capacitors 131 can also provide an isolation effect to prohibit the signal from passing through the wires 121 of the respective two-wire channel 12 directly, preventing reverse current.

3. In the case that the network-on-chip 3 is a voltage-mode design, the signal coupling circuit 1 comprises opposing first connection end 10 and second connection end 11, multiple two-wire channels 12 coupled between the first connection end 10 and the second connection end 11, and a plurality of coupling modules 13 respectively installed in the two-wire channels 12 and respectively electrically coupled between the first connection end 10 and the second connection end 11, wherein each two-wire channel 12 consists of two wires 121; each coupling module 13 comprises a first capacitor 131 connected to each wire 121. Because the charge and discharge speed of the first capacitors 131 has a great concern with the time constant, the time constant must match the signal cycle so that the charge and discharge time can just let the signal be transmitted in integrity without interruption. Increasing the capacitance of the first capacitors 131 relatively increases the time constant. Preferably, the capacitance of the first capacitors 131 is in the range of 100 μF~0.01 μF, or most preferably 0.1 μF.

4. The signal coupling circuit 1 can be configured to provide a plurality of coupling modules 13 respectively installed in the two-wire channels 12 and respectively electrically coupled between the first connection end 10 and the second connection end 11, and a plurality of filter modules 14 respectively installed in the two-wire channels 12 and respectively electrically coupled between and the respective coupling modules 13 and the first connection end 10 or second connection end 11. In one embodiment of the invention, each filter module 14 comprises the inductor 143 electrically connected in series to each wire 121 of the respective two-wire channel 12. In another embodiment of the invention, each filter module 14 comprises two second capacitors 144 electrically connected in series between the two wires 121 of the respective two-wire channel 12 with the midpoint between the two second capacitors 144 electrically connected to a second grounding terminal 145. By means of the inductors 143 or second capacitors 144, the filter modules 14 can effectively remove noises from the network signal.

In conclusion, the invention provides a network signal coupling circuit assembly using a signal coupling circuit 1 to couple a network connector 2 and a voltage-mode network-on-chip 3. The signal coupling circuit 1 comprises a plurality of two-wire channels 12 connected in parallel between opposing first connection end 10 and second connection end 11 thereof, and a plurality of coupling modules 13 respectively installed in the two-wire channels 12 and respectively electrically coupled between the first connection end 10 and the second connection end 11, wherein each coupling module 13 of the signal coupling circuit 1 comprises two first capacitors 131 respectively electrically connected to the two wires 121 of the respective two-wire channel 12 for isolating electricity and coupling network signals. Subject to the characteristic that increasing the capacitance strength can relatively enhance the signal coupling performance, the signal coupling circuit can effectively achieve optimal network signal coupling performance.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A network signal coupling circuit assembly, comprising a circuit board, a network-on-chip installed in said circuit board, a network connector, and a signal coupling circuit installed in said circuit board and electrically coupled between said network-on-chip and said network connector, wherein said signal coupling circuit comprises opposing first connection end and second connection end, a plurality of two-wire channels electrically connected between said first connection end and said second connection end, each said two-wire channel comprising two wires electrically connected in parallel between said first connection end and said second connection end, a coupling module installed in each said two-wire channel for coupling network signals between said network-on-chip and said network connector, each said coupling module comprising a first capacitor connected in series to each said wire of one respective said two-wire channel, wherein each said first capacitor has a capacitance in the range of 100 μF~0.01 μF.

2. The network signal coupling circuit assembly as claimed in claim 1, wherein the capacitance of each said first capacitor is preferably 0.1 μF.

3. The network signal coupling circuit assembly as claimed in claim 1, wherein said first connection end and said second connection end of said signal coupling circuit are respectively electrically coupled to said network connector and said network-on-chip; said signal coupling circuit further comprises a plurality of filter modules respectively installed in said two-wire channels and respectively electrically coupled between said coupling modules and one of said first connection end and said second connection end.

4. The network signal coupling circuit assembly as claimed in claim 3, wherein each said filter module comprises an inductor electrically connected in series to each said wire of the respective said two-wire channel.

5. A network signal coupling circuit assembly, comprising a network connector, a circuit board installed in said network connector, a network-on-chip, and a signal coupling circuit electrically coupled between said network-on-chip and said network connector, wherein said signal coupling circuit comprises opposing first connection end and second connection end, a plurality of two-wire channels electrically connected between said first connection end and said second connection end, each said two-wire channel comprising two wires electrically connected in parallel between said first connection end and said second connection end, a coupling module installed in each said two-wire channel for coupling network signals between said network-on-chip and said network connector, each said coupling module comprising a first capacitor connected in series to each said wire of one respective said two-wire channel, wherein each said first capacitor has a capacitance in the range of 100 µF~0.01 µF.

6. The network signal coupling circuit assembly as claimed in claim 5, wherein the capacitance of each said first capacitor is preferably 0.1 µF.

7. The network signal coupling circuit assembly as claimed in claim 5, wherein said first connection end and said second connection end of said signal coupling circuit are respectively electrically coupled to said network connector and said network-on-chip; said signal coupling circuit further comprises a plurality of filter modules respectively installed in said two-wire channels and respectively electrically coupled between said coupling modules and one of said first connection end and said second connection end.

8. The network signal coupling circuit assembly as claimed in claim 7, wherein each said filter module comprises an inductor electrically connected in series to each said wire of the respective said two-wire channel.

9. The network signal coupling circuit assembly as claimed in claim 7, wherein each said filter module comprises two second capacitors electrically connected in series between the two wires of the respective said two-wire channel with the midpoint between said two second capacitors electrically connected to a second grounding terminal.

* * * * *